(12) United States Patent
Adachi (10) Patent No.: US 10,879,409 B2
(45) Date of Patent: Dec. 29, 2020

(54) CRYSTALLINE SILICON SOLAR CELL, PRODUCTION METHOD THEREFOR, AND SOLAR CELL MODULE

(71) Applicant: KANEKA CORPORATION, Osaka (JP)

(72) Inventor: Daisuke Adachi, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/160,112

(22) Filed: Oct. 15, 2018

(65) Prior Publication Data

US 2019/0051777 A1 Feb. 14, 2019

Related U.S. Application Data

(63) Continuation of application No. PCT/JP2017/007304, filed on Feb. 27, 2017.

(30) Foreign Application Priority Data

Apr. 13, 2016 (JP) .................................. 2016-080195

(51) Int. Cl.
*H01L 31/046* (2014.01)
*H01L 31/054* (2014.01)
(Continued)

(52) U.S. Cl.
CPC ...... *H01L 31/046* (2014.12); *H01L 31/02363* (2013.01); *H01L 31/022425* (2013.01);
(Continued)

(58) Field of Classification Search
None
See application file for complete search history.

(56) References Cited

U.S. PATENT DOCUMENTS 4,361,950 A * 12/1982 Amick ............ H01L 31/022433
136/256
5,679,234 A * 10/1997 Imamura ................ C25D 5/022
205/123
(Continued)

FOREIGN PATENT DOCUMENTS

JP 2014-175441 A 9/2014
WO 2014/066265 A1 5/2014
(Continued)

OTHER PUBLICATIONS

International Search Report issued in International Application No. PCT/JP2017/007304, dated May 23, 2017 (2 pages).
(Continued)

*Primary Examiner* — Devina Pillay
(74) *Attorney, Agent, or Firm* — Osha Bergman Watanabe & Burton LLP (57) ABSTRACT

A crystalline silicon-based solar cell includes a crystalline silicon substrate having a first principal surface, a second principal surface, and a lateral surface. On the first principal surface is arranged, in the following order, a first intrinsic silicon-based thin-film, a first conductive silicon-based thin-film, a light-receiving-side transparent electrode layer and a light-receiving-side metal electrode. On the second principal surface is arranged, in the following order, a second intrinsic silicon-based thin-film, a second conductive silicon-based thin-film, a back-side transparent electrode layer and a back-side metal electrode. The second conductive silicon-based thin-film has a conductivity-type different from that of the first conductive silicon-based thin-film. Both the first principal surface and the second principal surface are textured. Both the light-receiving-side metal electrode and the back-side metal electrode have a pattern shape. The back-
(Continued)

side transparent electrode layer is not provided on a peripheral edge of the second principal surface.

15 Claims, 7 Drawing Sheets (51) Int. Cl.
*H01L 31/0747* (2012.01)
*H02S 40/22* (2014.01)
*H01L 31/0224* (2006.01)
*H01L 31/0236* (2006.01)
*H01L 31/049* (2014.01)
*H01L 31/0368* (2006.01)
*H01L 31/18* (2006.01)

(52) U.S. Cl.
CPC ......... *H01L 31/022441* (2013.01); *H01L 31/022466* (2013.01); *H01L 31/03682* (2013.01); *H01L 31/049* (2014.12); *H01L 31/054* (2014.12); *H01L 31/0747* (2013.01); *H01L 31/182* (2013.01); *H01L 31/1884* (2013.01); *H02S 40/22* (2014.12); *Y02E 10/52* (2013.01)

(56) References Cited

U.S. PATENT DOCUMENTS

| 9,722,101 | B2* | 8/2017 | Adachi | H01L 31/022425 |
| 2010/0132792 | A1* | 6/2010 | Kim | H01L 31/022425 |
| | | | | 136/258 |
| 2010/0319768 | A1* | 12/2010 | Mitchell | H01L 31/022433 |
| | | | | 136/256 |
| 2014/0116495 | A1 | 5/2014 | Kim et al. | |
| 2015/0075601 | A1* | 3/2015 | Adachi | H01L 31/022425 |
| | | | | 136/256 |
| 2015/0364616 | A1 | 12/2015 | Tohoda | |
| 2016/0308079 | A1 | 10/2016 | Adachi et al. | |
| 2017/0084772 | A1 | 3/2017 | Uto et al. | |

FOREIGN PATENT DOCUMENTS

| WO | 2014/132312 A1 | 9/2014 |
| WO | 2015/064634 A1 | 5/2015 |
| WO | 2015/166780 A1 | 11/2015 |

OTHER PUBLICATIONS

International Preliminary Report on Patentability issued in International Application No. PCT/JP2017/007304, dated Oct. 25, 2018 (6 pages).

* cited by examiner

CRYSTALLINE SILICON SOLAR CELL, PRODUCTION METHOD THEREFOR, AND SOLAR CELL MODULE

TECHNICAL FIELD

One or more embodiments of the invention relate to a crystalline silicon-based solar cell having a heterojunction on a crystalline silicon substrate surface, and manufacturing method therefor. One or more embodiments of the invention also relate to a solar cell module.

BACKGROUND

As one of crystalline silicon-based solar cells having the highest conversion efficiency a heterojunction solar cell in which a conductive silicon-based thin-film is disposed on a single crystalline silicon substrate is put into practical use. In the heterojunction solar cell, a transparent electrode layer is disposed on a light-receiving surface and a back surface, and photocarriers are extracted to outside by a metal electrode disposed on the transparent electrode layer. The metal electrode can be formed by printing an electroconductive paste etc., electroplating, or the like.

Electroplating can be expected to contribute to improvement of properties and productivity by reduction of the resistance of a metal electrode, or reduction of cost because the metal electrode can be easily formed with a large thickness. Patent Document 1 discloses a heterojunction solar cell in which a patterned metal electrode is formed on the light-receiving side by electroplating. Patent Document 2 discloses a heterojunction solar cell in which a metal electrode is formed on the entire surface on the back side by electroplating.

PATENT DOCUMENTS

Patent Document 1: International Publication No. WO 2015/064634
Patent Document 2: International Publication No. WO 2015/166780

Patent Document 2 suggests that by forming a metal electrode on the entire back surface of a solar cell, light which is incident to the cell and which is transmitted without being absorbed by a silicon substrate can be reflected at a metal electrode on the back side, and reused. On the other hand, in a solar cell module obtained by electrically connecting a plurality of solar cells (cells) by a wiring member, capture of light incident to the cell from the back surface also contributes to improvement of the power generation. In a solar cell module, the power generation amount in the module can be improved when light incident to a gap (generally about 2 to 4 mm) between adjacently arranged cells is reflected at a back sheet or the like disposed on the back side of the cell, and the light is caused to enter from a light-receiving surface or a back surface of the cell.

SUMMARY

One or more embodiments of the present invention provide a crystalline silicon-based solar cell which is excellent in efficiency of capturing light incident between cells when modularized.

The solar cell of one or more embodiments of the present invention is a crystalline silicon-based solar cell including a first intrinsic silicon-based thin-film, a first conductive silicon-based thin-film, a light-receiving-side transparent electrode layer and a light-receiving-side metal electrode in this order on a first principal surface of a crystalline silicon substrate, and including a second intrinsic silicon-based thin-film, a second conductive silicon-based thin-film, a back-side transparent electrode layer and a back-side metal electrode on a second principal surface of the crystalline silicon substrate. In one or more embodiments the first conductive silicon-based thin-film and the second conductive silicon-based thin-film have different conductivity-types, where one of the conductive silicon-based thin-films is p-type, and the other is n-type. In one or more embodiments a texture is formed on each of the first principal surface and the second principal surface of the crystalline silicon substrate. Each of the light-receiving-side metal electrode and the back-side metal electrode has a pattern shape.

In one or more embodiments a back-side metal seed may be disposed between the back-side transparent electrode layer and the back-side metal electrode. A light-receiving-side metal seed may be disposed between the light-receiving-side transparent electrode layer and the light-receiving-side metal electrode.

In one or more embodiments, the back-side transparent electrode layer is not provided on the peripheral edge of the second principal surface. For ensuring that the back-side electrode layer is not formed on the peripheral edge of the second principal surface, for example, the back-side transparent electrode layer may be deposited while the peripheral edge of the second principal surface is covered with a mask. In one or more embodiments, the light-receiving-side transparent electrode layer is disposed on the entire first principal surface, and wrapped around and disposed on the lateral surface and the peripheral edge of the second principal surface. When the light-receiving-side transparent electrode layer is wrapped around and disposed on the peripheral edge of the second principal surface, it is preferable that an end-portion flattening metal layer is disposed on the wrap-around portion to the back side of the light-receiving-side transparent electrode.

In one or more embodiments, the patterned light-receiving-side metal electrode and back-side metal electrode can be formed using, for example, a resist. A patterned metal electrode layer can be formed by deposition of a metal by electroplating in which an electroconductive layer (transparent electrode layer or metal seed layer) exposed under an opening of a resist pattern serves as an origination point. The light-receiving-side electrode and the back-side electrode may be simultaneously formed by electroplating.

The solar cell of one or more embodiments of the present invention has an end-portion flattening metal layer on the peripheral edge on the back side. The end-portion flattening metal layer is disposed apart from the back-side transparent electrode. Owing to the end-portion flattening metal, light which is incident to a gap between cells, and then reflected at a back sheet or the like to reach the back surface of the solar cell can be efficiently captured in the solar cell by reflecting the light in a predetermined direction. The end-portion flattening metal layer is formed by, for example, electroplating. When the light-receiving-side metal electrode is formed by electroplating, the end-portion flattening metal layer is formed concurrently with the light-receiving-side metal electrode by electroplating, and it is preferable that both the end-portion flattening metal layer and the light-receiving-side metal electrode are composed of the same material.

Further, one or more embodiments of the present invention relate to a solar cell module that include the crystalline silicon-based solar cell. The solar cell module of one or more embodiments of the present invention includes a solar cell string, in which a plurality of solar cells are electrically connected, between a light-receiving-surface protecting member and a back-surface protecting member. As the back-surface protecting member, one having light-reflectivity is preferably used.

Since an end-portion flattening metal layer is disposed on the peripheral edge on the back side of a solar cell, reflected light of light applied to a gap between the solar cells is efficiently captured in the solar cell from a back surface. Thus, the module power generation amount can be improved.

DETAILED DESCRIPTION OF THE EMBODIMENTS

Figure 1:
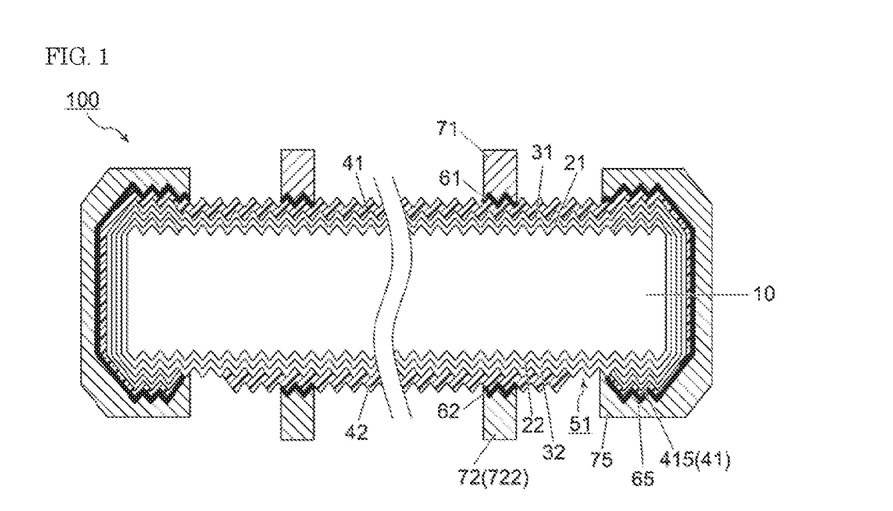
FIG. 1 is a schematic sectional view of a crystalline silicon-based solar cell according to one or more embodiments.
Figure 2:
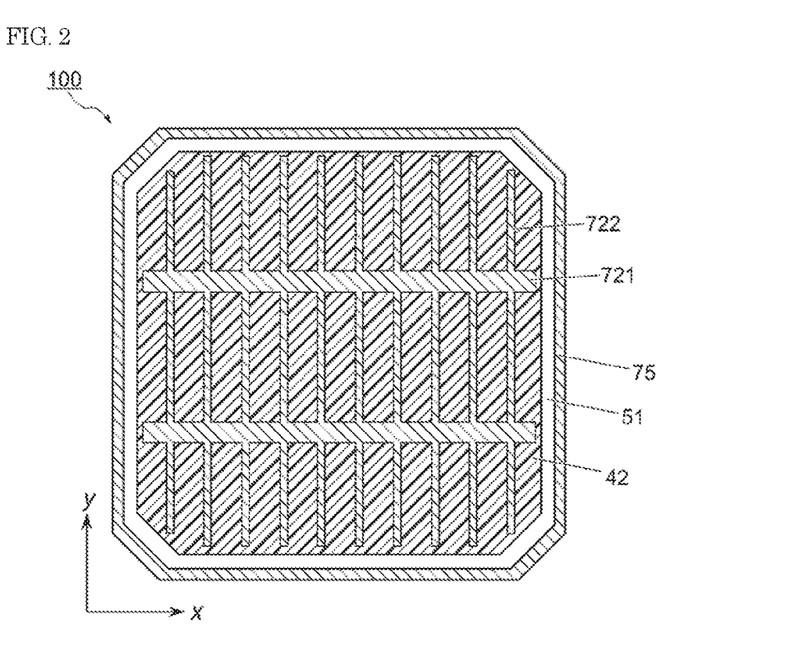
FIG. 2 is a schematic sectional view of a crystalline silicon-based solar cell according to one or more embodiments.

FIG. 1 is a schematic sectional view of a crystalline silicon-based solar cell 100 according to one or more embodiments of the present invention. FIG. 2 is a plane view of the crystalline silicon-base solar cell 100 viewed from back side.

The crystalline silicon-based solar cell 100 is so called a heterojunction solar cell, and includes a first intrinsic silicon-based thin-film 21, a first conductive silicon-based thin-film 31, a light-receiving-side transparent electrode layer 41 and a light-receiving-side metal electrode 71 on the first principal surface of the crystalline silicon substrate 10; and a second intrinsic silicon-based thin-film 22, a second conductive silicon-based thin-film 32, a back-side transparent electrode layer 42 and a back-side metal electrode 72 on the second principal surface of the crystalline silicon substrate 10. In this crystalline silicon-based solar cell 100, the first principal surface-side (upper side in FIG. 1) is light-receiving surface and the second principal surface-side (lower side in FIG. 1) is back surface.

In one or more embodiments, the crystalline silicon substrate 10 has p-type or n-type conductivity. In comparison between holes and electrons, electrons have a smaller effective mass and scattering cross-sectional area, and thus have a larger mobility. Therefore, an n-type single-crystalline silicon substrate is preferably used as the crystalline silicon substrate 10.

In one or more embodiments, the crystalline silicon substrate 10 has a textured structure on each of the first principal surface and the second principal surface. By providing a texture on the surface of the silicon substrate, reflection of light on the surface is reduced, so that the amount of light captured in the silicon substrate can be increased. The irregularity height of the texture is preferably about 0.5 to 10 μm.

In one or more embodiments, the first intrinsic silicon-based thin-film 21 on the light-receiving side and the second intrinsic silicon-based thin-film 22 on the back side are preferably i-type hydrogenated amorphous silicon composed of silicon and hydrogen. When an intrinsic silicon-based thin-film is deposited on a surface of the crystalline silicon substrate 10, surface passivation can be effectively performed while suppressing diffusion of impurities to the crystalline silicon substrate.

In one or more embodiments, a first conductive silicon-based thin-film 31 is disposed on the first intrinsic silicon-based thin-film 21, and a second conductive silicon-based thin-film 32 is disposed on the second intrinsic silicon-based thin-film 22. The first conductive silicon-based thin-film 31 and the second conductive silicon-based thin-film 32 have different conductivity-types, where one of the conductive silicon-based thin-films is p-type, and the other is n-type. Photo induced carrier collecting efficiency is enhanced when the heterojunction on the light-receiving side is a reverse junction. Therefore, when the crystalline silicon substrate 10 is n-type, it is preferable that the first conductive silicon-based thin-film 31 on the light-receiving side is p-type and the second conductive silicon-based thin-film 32 on the back side is n-type.

In one or more embodiments, the light-receiving-side transparent electrode layer 41 is disposed on the first conductive silicon-based thin-film 31, and the back-side transparent electrode layer 42 is disposed on the second conductive silicon-based thin-film 32. The light-receiving-side transparent electrode layer 41 may be disposed on the entire first principal surface, and is not required to be disposed on the peripheral edge of the first principal surface. As shown in FIG. 1, the light-receiving-side transparent electrode layer 41 may be disposed on the entire first principal surface, and wrapped around and formed on the lateral surface and the peripheral edge of the second principal surface.

In one or more embodiments, the back-side transparent electrode layer 42 is not disposed on the peripheral edge of the second principal surface, and a back-side transparent electrode layer-non-formed region is present on the outer periphery of a back-side transparent electrode layer-formed region at the peripheral edge of the second principal surface. Thus, even when the light-receiving-side transparent electrode layer 41 is wrapped around and formed on the peripheral edge of the back surface, a region (separation region) 50 which is not provided with an electrode is present between the back-side transparent electrode layer 42 and a wrap-around portion 415 of the light-receiving-side transparent electrode layer (see FIG. 6E), so that the light-receiving-side transparent electrode layer 41 and the back-side transparent electrode layer 42 are separated from each other.

In one or more embodiments, the patterned light-receiving-side metal electrode 71 is disposed on the light-receiving-side transparent electrode layer 41, and the patterned back-side metal electrode 72 is disposed on the back-side transparent electrode layer 42. Since the metal electrode is formed in a pattern shape on the back surface, as well as on the light-receiving surface, light can also be captured from the back side of the solar cell. The pattern shape of the metal electrode is not particularly limited, and for example, as shown in FIG. 2, the metal electrode is provided in the form of a grid including a bus bar electrode 721 extending in one direction (x direction), and a finger electrode 722 extending orthogonally to the bus bar electrode 721.

In one or more embodiments, the light-receiving-side metal electrode 71 and the back-side metal electrode 72 are preferably plated metal layers formed by electroplating. The light-receiving-side metal electrode 71 and the back-side metal electrode 72 may include a plurality of metal layers. For example, when a metal layer having high durability, such as that of silver, tin or the like, is disposed on the copper layer, deterioration of the metal electrode can be suppressed to improve the durability of the solar cell.

In one or more embodiments, a light-receiving-side metal seed 61 may be disposed between the light-receiving-side transparent electrode layer 41 and the light-receiving-side metal electrode 71. A back-side metal seed 62 may be disposed between the back-side transparent electrode layer 42 and the back-side metal electrode 72. Preferably the light-receiving-side metal seed 61 and the back-side metal seed 62 are patterned in the same manner as in the case of the light-receiving-side metal electrode 71 and the back-side metal electrode 72, respectively.

As shown in FIG. 2, in one or more embodiments an end-portion flattening metal layer 75 is disposed on the peripheral edge of the second principal surface. The end-portion flattening metal layer 75 is apart from the back-side transparent electrode layer 42, and a separation region 51 where the second conductive silicon-based thin-film 32 is exposed is present between the end-portion flattening metal layer 75 and the back-side transparent electrode layer 42. Since the end-portion flattening metal layer 75 is disposed on the peripheral edge of the back surface, light incident to a gap between adjacently arranged solar cells can be efficiently captured from the back side of the solar cell when a plurality of solar cells 100 are connected and modularized.

Figure 3:
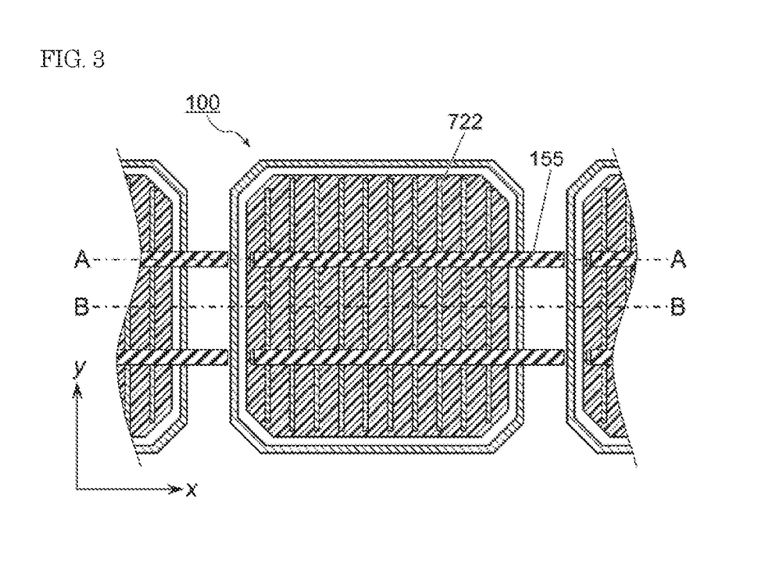
FIG. 3 is a plan view of a solar cell module according to one or more embodiments.
Figure 4A:
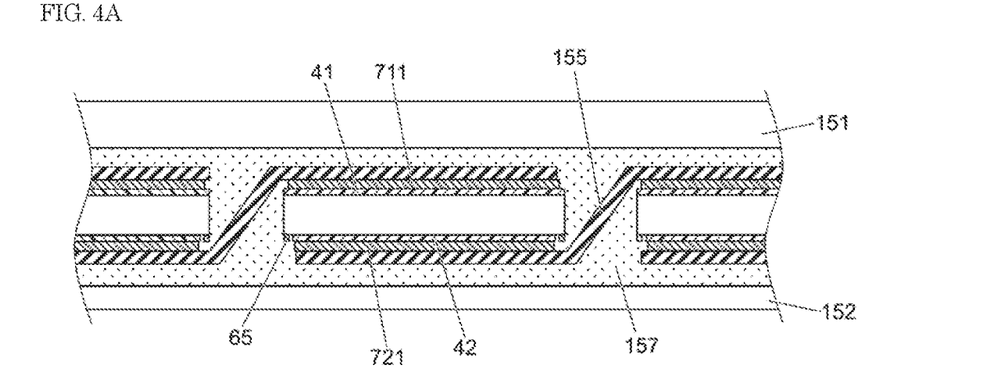
FIG. 4A is a sectional view at the position of line A-A in FIG. 3.

FIG. 3 is a plan view of a solar cell module 200 in which a plurality of solar cells 100 are connected through a wiring member 155. FIG. 4A is a sectional view at the position of line A-A in FIG. 3, and FIG. 4B is a sectional view at the position of line B-B in FIG. 3.

In the solar cell module 200 of one or more embodiments, the bus bar electrodes 711 and 721 on the light-receiving side and back side of adjacent solar cells are connected through the wiring member 155 to form a solar cell string. A light-receiving-surface protecting member 151 is disposed on the light-receiving side (upper side in FIGS. 4A and 4B) of the solar cell string, and a back-surface protecting member 152 is disposed on the back side (lower side in FIGS. 4A and 4B) of the solar cell string. An encapsulant 157 is packed between the protecting members 151 and 152 to encapsulate the solar cell string.

Figure 4B:
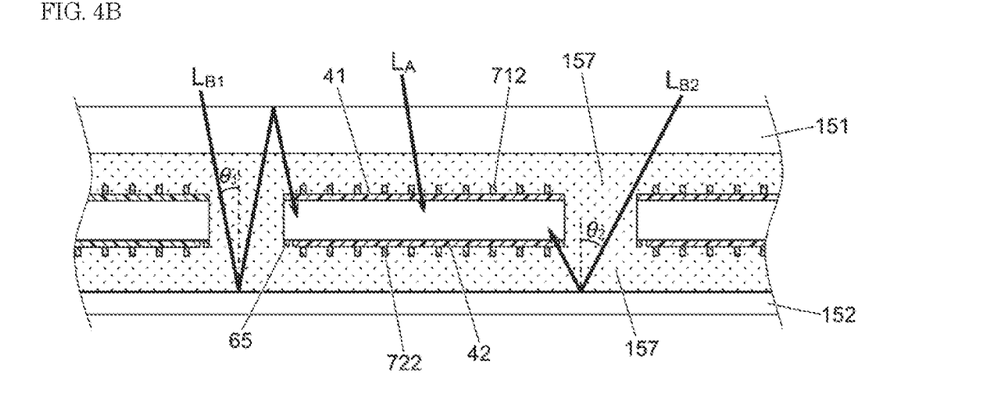
FIG. 4B is a sectional view at the position of line B-B in FIG. 3.

FIG. 4B conceptually shows a state of one or more embodiments in which sunlight is incident to the solar cell 100 in the solar cell module 200. Light $L_A$ applied to the solar cell is incident to the solar cell from the light-receiving surface, and absorbed by the silicon substrate 10, so that photocarriers are generated to contribute to power generation. Light applied to the gap between the adjacent solar cells reaches the back-surface protecting member 152 arranged on the back surface of the solar cell 100. Light applied to the gap is reflected to the light-receiving side by the back-surface protecting member 152, and caused to enter the solar cell, so that light utilization efficiency can be enhanced to improve the module power generation amount.

A part of light applied to the gap between the solar cells, and reflected at the back-surface protecting member 152 (particularly light $L_{B1}$ having a small incidence angle $\theta_1$) is transmitted through the gap between the solar cells again, reaches the light-receiving side, and is re-reflected at the air interface of the light-receiving-surface protecting member 151, and incident to the cell from the light-receiving side. A part of light applied to the gap between cells, and reflected at the back-surface protecting member 152 (particularly light $L_{B2}$ having a large incident angle $\theta_2$) reaches the back surface of the solar cell. Most of reflected light reaching the back side of the solar cell from the back-surface protecting member 152 reaches a peripheral edge region of the solar cell.

Figure 5A:
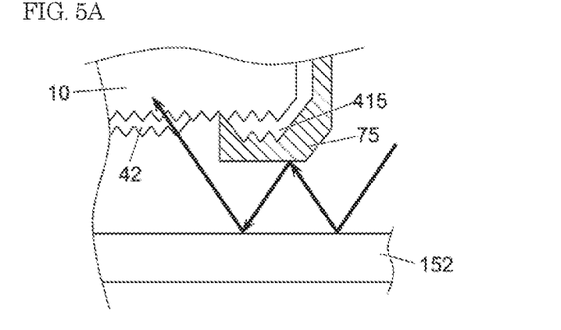
FIGS. 5A and 5B are conceptual diagrams showing a state of reflection of light which is reflected at the back-surface protecting member, and reaches the peripheral edge region of the back surface of the solar cell.
Figure 5B:
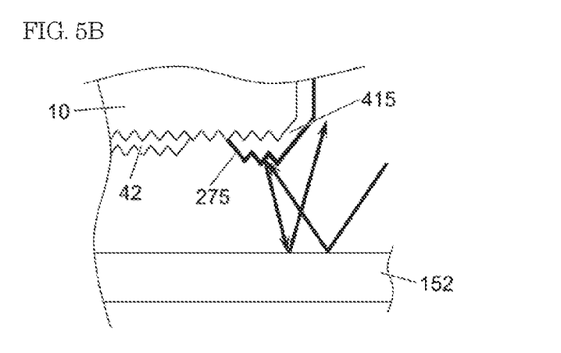

FIGS. 5A and 5B are conceptual diagrams of one or more embodiments, showing a state of reflection of light which is reflected at the back-surface protecting member 152, and reaches the peripheral edge region of the back surface of the solar cell. In FIG. 5A the flattening metal layer 75 is disposed on the peripheral edge of the back surface of the solar cell. In FIG. 5B, a metal layer 275 with small thickness (e.g., a metal layer formed on the wraparound portion 415 of the transparent electrode layer by sputtering) is formed on the peripheral edge of the back surface of the solar cell. This metal layer does not have an effect of moderating the irregular shape of a texture (flattening effect)

Since the metal layer 275 in FIG. 5B does not have a flattening effect, the peripheral edge of the back surface of the solar cell has a surface irregular shape inheriting the irregular shape of the texture of the silicon substrate 10. Light which is reflected at the back-surface protecting member 152, and reaches the peripheral edge region of the back surface of the solar cell is reflected in various directions by the metal layer 275 having surface irregularities. Light reflected at the metal layer 275 is repeatedly reflected at the back-surface protecting member 152 etc., and a part of the light is incident into the solar cell from the back surface and the light-receiving surface of the solar cell. However, as the reflection frequency increases, the amount of light absorbed by the encapsulant 157 etc. increases, and therefore the amount of light incident to the solar cell decreases.

On the other hand, in FIG. 5A, the flattening metal layer 75 of one or more embodiments is formed on the peripheral edge of the back surface of the solar cell, and the irregular shape of the texture of the silicon substrate 10 is moderated, so that the silicon substrate 10 has a flattened surface shape. Light which is reflected at the back-surface protecting member 152, and reaches the peripheral edge region of the back surface of the solar cell is reflected by the flattening metal layer 75. Since the surface is flattened, light reaching the flattening metal layer 75 from the gap between the solar cells (on the right side in the drawing) is easily reflected toward the center side (the left side in the drawing) of the solar cell. Light reflected to the center side of the solar cell is repeatedly reflected between the back-surface protecting member 152 and the flattening metal layer 75, and incident to the solar cell from the back surface. As compared to light reflected in an indefinite direction as in FIG. 5B, light reflected to the center side of the solar cell as in FIG. 5A is incident to the solar cell from the back side with a smaller reflection frequency, and therefore the amount of reflected light that is captured in the solar cell increases. Therefore, by forming the flattening metal layer 75 on the peripheral edge of the back surface, the amount of light captured in the module can be increased to improve the module power generation amount.

For flattening the irregularity of the texture on the back surface of the silicon substrate 10 of one or more embodiments, it is preferable that the flattening metal layer 75 has a large thickness. The thickness of the flattening metal layer 75 is preferably 1 µm or more, more preferably 3 µm or more, further preferably 5 µm or more. The thickness of the flattening metal layer 75 is preferably larger than the irregularity height difference in the texture of the back surface of the silicon substrate 10. The irregularity height difference of the flattening metal layer 75 is preferably not more than 0.5 times, more preferably not more than 0.3 times, further preferably not more than 0.1 times the irregularity height difference of the silicon substrate 10. When the flattening metal layer 75 has a small irregularity height difference, and thus has a flattened surface, the amount of reflected light captured in the solar cell from the back surface tends to increase. The irregularity height difference of the flattening metal layer 75 is preferably 1 µm or less, more preferably 0.5 µm or less, further preferably 0.3 µm or less, especially preferably 0.1 µm or less. The irregularity height difference is defined as a value doubling the arithmetic mean roughness Ra.

In one or more embodiments, a plating method is suitable for forming the flattening metal layer 75 having a large thickness. In particular, from the viewpoint of productivity, it is preferable that the light-receiving-side metal electrode 71 and the back-side metal electrode 72 are formed by electroplating, and concurrently with the formation of these metal electrodes, the flattening metal layer 75 is formed by electroplating.

Hereinafter, one example of a process for manufacturing the heterojunction solar cell 100 including the p-type silicon-based thin-film 31 as a first conductive silicon-based thin-film on the light-receiving side of the n-type single-crystalline silicon substrate 10, and including the n-type silicon-based thin-film 32 as a second conductive silicon-based thin-film on the back side will be described with reference to FIGS. 6A to 6J.

Figure 6A:
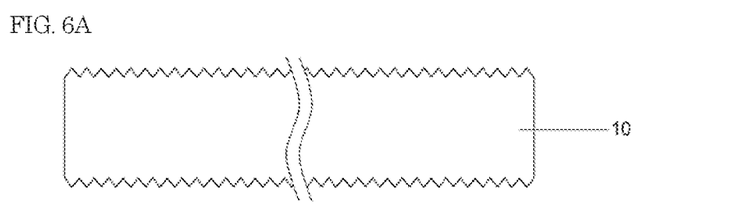
FIGS. 6A to 6J are schematic sectional views showing a solar cell manufacturing process.

First, an n-type single-crystalline silicon substrate with a texture formed on each of both a first principal surface (light-receiving surface) and a second principal surface (back surface) is provided (FIG. 6A). The method for forming the texture is not particularly limited. For example, on a single-crystalline silicon substrate, a pyramid-shaped texture can be formed by an anisotropic etching treatment with an alkali.

Figure 6B:
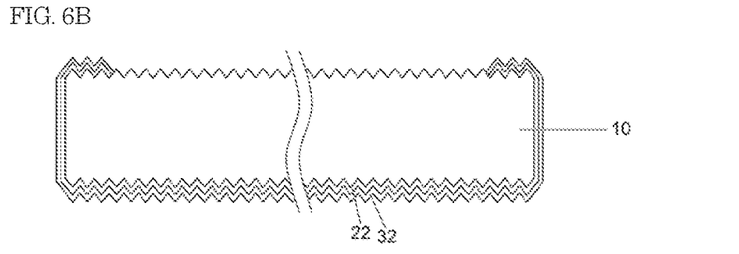
Figure 6C:
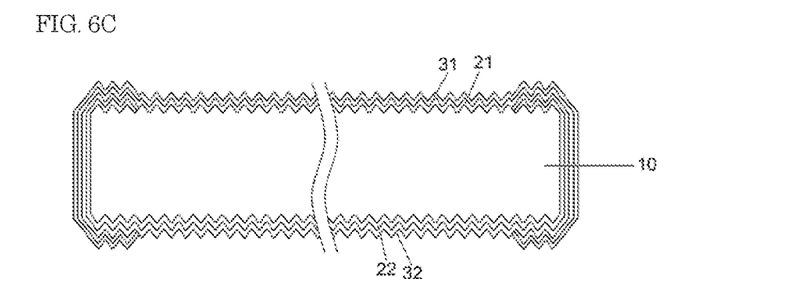

The second intrinsic silicon-based thin-film 22 and the n-type silicon-based thin-film 32 are formed on the second principal surface of the n-type single-crystalline silicon substrate 10 (FIG. 6B), and the first intrinsic silicon-based thin-film 21 and the p-type silicon-based thin-film 31 are formed on the first principal surface of the n-type single-crystalline silicon substrate 10 (FIG. 6C).

In one or embodiments, i-type hydrogenated amorphous silicon composed of silicon and hydrogen is preferable as a material of the intrinsic silicon-based thin-films 21 and 22. The thickness of each of the intrinsic silicon-based thin-films 21 and 22 is preferably 3 to 16 nm, more preferably 4 to 14 nm, further preferably 5 to 12 nm. In this specification, the "thickness" refers to a thickness on the deposition surface, and the thickness direction is defined as a direction of the normal of the texture slope.

In one or more embodiments, as the conductive silicon-based thin-films 31 and 32, amorphous silicon-based thin-films, microcrystalline silicon-based thin-films (thin-films containing amorphous silicon and crystalline silicon), and so on are used. As the silicon-based thin-film, silicon-based alloys such as silicon oxide, silicon carbide and silicon nitride can be used besides silicon. The conductive silicon-based thin-film is preferably an amorphous silicon thin-film among the silicon-based thin-films described above. The thickness of each of the conductive silicon-based thin-films 31 and 32 is preferably 3 to 30 nm.

In one or more embodiments, the silicon-based thin-films 21, 22, 31 and 32 are deposited by a plasma-enhanced CVD method. Although the order of deposition of these silicon-based thin-films is not particularly limited, it is preferable that the first intrinsic silicon-based thin-film 21 and the p-type silicon-based thin-film 31 are successively deposited using the same deposition apparatus from the viewpoint of improving productivity. Similarly, it is preferable that the second intrinsic silicon-based thin-film 22 and the n-type silicon-based thin-film 32 are successively deposited. Although FIGS. 6B and 6C show a mode in which deposition of the silicon-based thin-films 22 and 32 on the second principal surface side is performed first, the order of deposition of the first intrinsic silicon-based thin-film 21 and the p-type silicon-based thin-film 31 on the first principal surface and deposition of the second intrinsic silicon-based thin-film 22 and the n-type silicon-based thin-film 32 on the second principal surface is not limited.

During formation of the silicon-based thin-film of one or more embodiments, deposition may be performed while the peripheral edge of each of the first principal surface and the second principal surface is covered with a mask, or deposition may be performed without using a mask. Deposition may be performed using a mask during deposition of some of the silicon-based thin-films 21, 22, 31 and 32 and without using a mask during deposition of the other silicon-based thin-films.

In one or more embodiments, when the silicon-based thin-film is deposited by a dry process such as a CVD method without using a mask, the silicon-based thin-films 22 and 32 deposited on the second principal surface of the silicon substrate 10 are also formed on the lateral surface and the peripheral edge of the first principal surface of the silicon substrate 10 by wraparound during deposition. The silicon-based thin-films 21 and 31 deposited on the first principal surface of the silicon substrate 10 are also formed on the lateral surface and the peripheral edge of the second principal surface of the silicon substrate 10 by wraparound during deposition.

Since the first intrinsic silicon-based thin-film 21 and the second intrinsic silicon-based thin-film 22 of some embodiments are wrapped around and formed on the lateral surface and a surface opposite to the deposition surface, at least one of the first intrinsic silicon-based thin-film 21 and the second intrinsic silicon-based thin-film 22 is disposed on the entire first principal surface, the entire second principal surface and all regions of the lateral surface of the crystalline silicon substrate 10. Since the intrinsic silicon-based thin-film of some embodiments is disposed on both the principal surfaces and all regions of the lateral surface, the silicon substrate surface passivation effect is enhanced.

In one or more embodiments, when the p-type silicon-based thin-film 31 and the n-type silicon-based thin-film 32 are deposited without using a mask, the p-type silicon-based thin-film 31 is disposed on the entire first principal surface and the lateral surface, and the n-type silicon-based thin-film 32 is disposed on the entire second principal surface and the lateral surface. These conductive silicone-based thin-films are wrapped around and formed on a surface opposite to the deposition surface. Since the conductive silicon-based thin-film is disposed on the entire surface of the silicon substrate as described above, a region where photocarriers generated in the silicon substrate can be recovered, i.e., an effective power generation region of the solar cell is expanded.

Figure 6D:
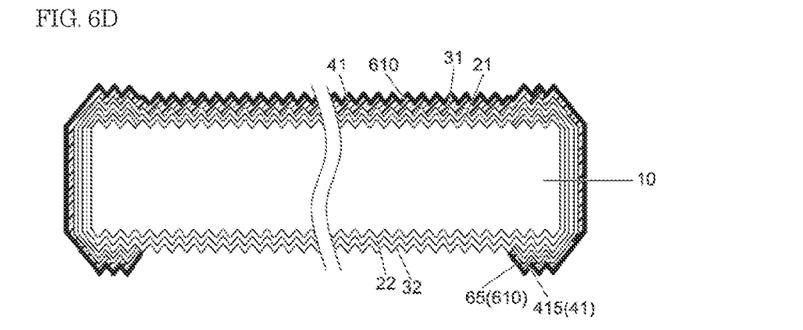
Figure 6E:
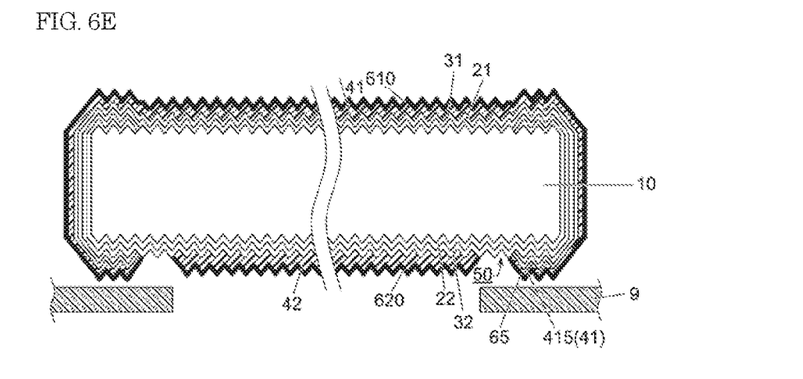

In one or more embodiments, the light-receiving-side transparent electrode layer 41 is formed on the p-type silicon-based thin-film 31 (FIG. 6D), and the back-side transparent electrode layer 42 is formed on the n-type silicon-based thin-film 32 (FIG. 6E). It is preferable that a light-receiving-side metal seed layer 610 is formed on the light-receiving-side transparent electrode layer 41, and it is preferable that a back-side metal seed layer 620 is formed on the back-side transparent electrode layer 42.

In one or more embodiments, the material of each of the transparent electrode layers 41 and 42 is preferably a conductive oxide, and, for example, zinc oxide, indium oxide, tin oxide and the like are used alone or as a composite oxide. Among them, indium-based oxides such as indium tin oxide (ITO) are preferable from the viewpoint of conductivity optical characteristics and long-term reliability. The transparent electrode layer may be a single layer, or may have a stacking configuration with a plurality of layers. From the viewpoint of transparency conductivity and reduction of light-reflection, the thicknesses of each of the light-receiving-side transparent electrode layer 41 and the back-side transparent electrode layer 42 are preferably about 10 to 200 nm.

In one or more embodiments, the method for depositing the transparent electrode layers 41 and 42 is preferably a dry process such as a CVD method, a sputtering method or a vapor deposition method, particularly preferably a physical vapor deposition method such as a sputtering method, or a CVD (MOCVD) method using a reaction of an organic metal compound with oxygen or water. When the metal seed layers 610 and 620 are formed on the transparent electrode layers 41 and 42, a sputtering method is especially preferable because both the layers can be successively deposited.

As described above, the back-side transparent electrode layer 42 of some embodiments is not formed on the peripheral edge of the second principal surface. By for example, depositing the back-side transparent electrode layer 42 while covering the peripheral edge of the second principal surface with a mask 9 as shown in FIG. 4E, a back-side transparent electrode layer-non-formed region is provided on the peripheral edge of the second principal surface.

As shown in FIG. 6D, the light-receiving-side transparent electrode layer 41 of some embodiments may be formed on the peripheral edge of the first principal surface and the lateral surface, and may be wrapped around and deposited on the back surface to form a wraparound portion 415. During formation of the light-receiving-side transparent electrode layer, a mask may be used, i.e., deposition may be performed while the peripheral edge of the first principal surface is covered with the mask. From the viewpoint of enhancing production efficiency by reducing the mask alignment frequency it is preferable that as shown in FIGS. 6D and 6E, the light-receiving-side transparent electrode layer 41 is deposited without using a mask, and the back-side transparent electrode layer 42 is deposited using a mask.

Since the back-side transparent electrode layer-non-formed region of one or more embodiments is provided on the peripheral edge of the second principal surface, a separation region 50 where neither of the transparent electrode layer 41 nor 42 is disposed is provided on the peripheral edge of the second principal surface even when the light-receiving-side transparent electrode layer is wrapped around and deposited on the back surface to form the wraparound portion 415. Since as described above, the back-side transparent electrode layer 42 is separated from the light-receiving-side transparent electrode layer 41, and these layers are not in conduction with each other, a leakage current on the light-receiving side and back side of the silicon substrate 10 is reduced to enhance the conversion efficiency of the solar cell. In addition, deposition of an undesired metal due to current leakage can be suppressed in formation of the metal electrodes 71 and 72 on the light-receiving-side transparent electrode layer 41 and the back-side transparent electrode layer 42 by electroplating. The light-receiving-side transparent electrode layer and the back-side transparent electrode layer are electrically separated, and therefore even when formation of the light-receiving-side metal electrode 71 on the light-receiving-side transparent electrode layer 41 and formation of the back-side metal electrode 72 on the back-side transparent electrode layer 42 are simultaneously performed by electroplating, the thickness of each of these electrodes can be independently controlled.

In one or more embodiments, the light-receiving-side metal seed layer 610 and the back-side metal seed layer 620 contribute to improvement of plating efficiency by acting as an electroconductive underlying layer in formation of the light-receiving-side metal electrode 71 and the back-side metal electrode 72 by electroplating. In addition, since the metal seed layers 610 and 620 are disposed on the surfaces of the transparent electrode layers 41 and 42, corrosion of the transparent electrode layer by a plating solution can be prevented.

As metallic materials that form the metal seed layers 610 and 620 of one or more embodiments, copper, nickel, tin, aluminum, chromium, silver, gold, zinc, lead, palladium, alloys thereof and the like are used. The thickness of each of the metal seed layers 610 and 620 is not particularly limited. With consideration given to the ease of removal by etching after electroplating, the thickness of each of the metal seed layers 610 and 620 is preferably 200 nm or less, more preferably 100 nm or less, further preferably 60 nm or less. On the other hand, from the viewpoint of imparting high conductivity to the metal seed layer itself and preventing exposure of the transparent electrode layers 41 and 42 through pinholes or the like, the thickness of each of the metal seed layers 610 and 620 is preferably 5 nm or more, more preferably 10 nm or more, further preferably 20 nm or more.

In one or more embodiments, although a method for forming the metal seed layers 610 and 620 is not particularly limited, a dry process such as a sputtering method or a vapor deposition method, or electroless plating is preferable for efficiently covering the entire surface of each of the transparent electrode layers 41 and 42. A sputtering method is especially preferable because the transparent electrode layers 41 and 42 and the metal seed layers 610 and 620 can be successively deposited.

In one or more embodiments, although the order of deposition of the transparent electrode layers 41 and 42 and the metal seed layers 610 and 620 is not particularly limited, it is preferable that the light-receiving-side transparent electrode layer 41 and the light-receiving-side metal seed layer 610 are successively deposited using the same deposition apparatus from the viewpoint of improvement of productivity. Thus, when the light-receiving-side transparent electrode layer 41 is deposited without using a mask, it is preferable that the light-receiving-side metal seed layer 610 is deposited without using a mask, so that a wraparound portion 65 is formed on the back surface. Preferably, the back-side transparent electrode layer 42 and the back-side metal seed layer 620 are successively deposited. When the back-side metal seed layer 620 is formed using a mask, the mask used during deposition of the back-side transparent electrode layer 42 may be used as it is. When the back-side transparent electrode layer and the back-side metal seed layer 620 are successively deposited using the same mask, the mask alignment frequency can be reduced to improve productivity. FIGS. 6D and 6E show a mode in which the light-receiving-side transparent electrode layer 41 and the light-receiving-side metal seed layer 610 on the first principal surface side are deposited first. Deposition of the back-side transparent electrode layer 42 and the back-side metal seed layer 620 on the second principal surface may precede deposition of the light-receiving-side transparent electrode layer 41 and the light-receiving-side metal seed layer 610 on the first principal surface.

In one or more embodiments, a patterned light-receiving-side metal electrode 71 is formed on the light-receiving-side transparent electrode layer 41, and the patterned back-side metal electrode 72 is formed on the back-side transparent electrode layer 42. When the metal seed layers 610 and 620 are disposed on the transparent electrode layers 41 and 42, a metal electrode is formed on the metal seed layer. By using a resist, the patterned metal electrode can be formed by a plating method as shown in FIGS. 6F to 6H.

Figure 6F:
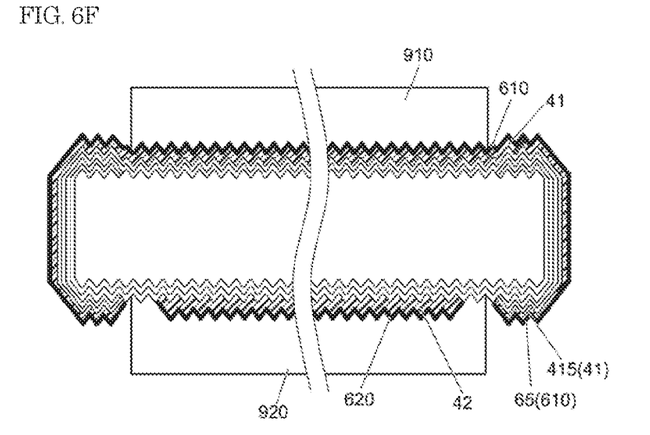

In formation of the metal electrode of one or more embodiments using a resist, resist layers 910 and 920 are first formed on the light-receiving surface and the back surface (FIG. 6F). Preferably, the resist layers 910 and 920 are formed on the light-receiving surface and the back surface, respectively by a printing method such as screen printing. When printing of a resist layer is performed with an area smaller than that of the silicon substrate, the utilization efficiency of a resist material is enhanced.

In one or more embodiments, the resist layer 920 on the back side is disposed so as to cover the entire surface of the back-side transparent electrode layer 42 (and on the back-side metal seed layer 620). When the resist layer 920 is printed in such a manner that the entire surface of the back-side transparent electrode layer 42 is covered, and the resist layer 920 is not disposed on the peripheral edge of the back surface, the end-portion flattening metal layer 75 apart from the back-side transparent electrode layer 42 can be formed by a plating method.

Figure 6G:
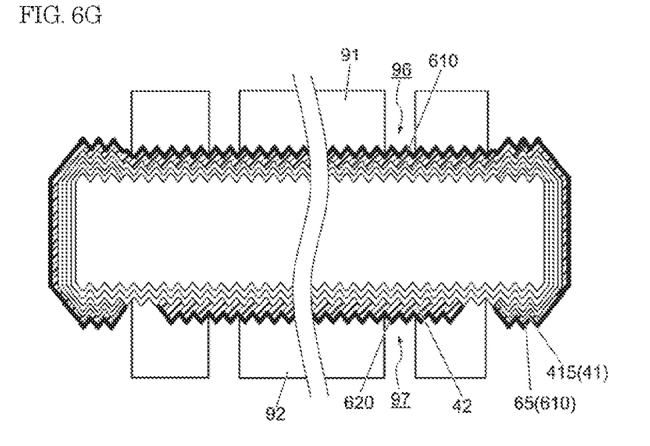
Figure 6H:
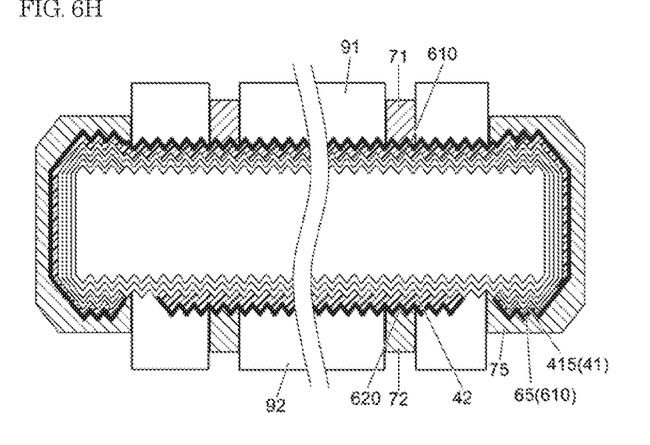

In one or more embodiments, by exposing and developing each of the resist layer 910 on the light-receiving side and the resist layer 920 on the back side, resist patterns 91 and 92 having openings 96 and 97 are formed (FIG. 6G).

In one or more embodiments, after formation of the resist patterns 91 and 92 on the light-receiving surface and the back surface, respectively, the metal electrodes 71 and 72 are formed by electroplating in which electroconductive layers (transparent electrode layers 41 and 42 or metal seed layers 610 and 620) exposed under the openings 96 and 97 serve as an origination point (FIG. 6H). Material of the metal electrodes 71 and 72 is not particularly limited as long as it can be deposited by a plating method. For example, copper nickel, tin, aluminum, chromium, silver, gold, zinc, lead, palladium, alloys thereof or the like may be formed. Among them, copper or an alloy including copper as a main component is preferable for the metal that forms the plated metal electrode due to high precipitation rate in electroplating high electroconductivity and low material cost.

In one or more embodiments, formation of the metal electrodes 71 and 72 is performed by immersing an anode in a plating solution, and applying a voltage between the anode and the transparent electrode layer 41 or 42 with the transparent electrode layer (or the metal seed layer 610 or 620 formed on the surface thereof) brought into contact with the plating solution. A plated metal electrode including copper as a main component can be formed by, for example, an acidic copper plating. A plating solution used for acidic copper plating contains copper ions, and a solution of known composition, which includes copper sulfate, sulfuric acid and water as main components, can be used. Copper can be precipitated on the electroconductive layer under a resist opening by causing a current of 0.1 to 10 $A/dm^2$ to pass the plating solution. The suitable plating time is appropriately set according to the area of the electrode, the current density, cathode current efficiency desired thickness and so on.

Either the light-receiving-side metal electrode 71 or the back-side metal electrode 72 may be formed first. From the viewpoint of productivity, it is preferable that both the electrodes are simultaneously formed by electroplating. For example, by supplying electricity to each of the light-receiving-side transparent electrode layer 41 (or the light-receiving-side metal seed layer 610) and the back-side transparent electrode layer 42 (or the back-side metal seed layer 620), the plated metal electrodes 71 and 72 can be simultaneously formed on the light-receiving surface and the back surface, respectively.

Since the electroconductive layers 41 and 610 on the light-receiving side and the electroconductive layers 42 and 620 on the back side are electrically separated as described above, it is possible to independently control the rate at which a metal is deposited on each of the light-receiving surface and the back surface by electroplating. Thus, even when the light-receiving-side metal electrode 71 and the back-side metal electrode 72 are simultaneously formed by electroplating, the thickness of each of these layers can be independently controlled. For example, the thickness of the plated metal electrode 72 on the back side can be made smaller than the thickness of the plated metal electrode 71 on the light-receiving side. When the thickness of the metal electrode formed by electroplating is small, the resist may have a small thickness. Thus, by adjusting the thickness of the metal electrode according to a difference between electrode pattern shapes on the light-receiving side and on the back side, the number of finger electrodes, and so on, a solar cell excellent in light capture efficiency and carrier extraction efficiency can be formed, and also material costs for the resist and so on can be reduced.

In one or more embodiments, the plated metal electrodes 71 and 72 may be a stack of a plurality of layers. For example, by forming a first plating layer made of a material having a high electroconductivity, such as copper, and then forming a metal layer that has higher chemical stability than the first plated metal layer, a metal electrode having low resistance and being excellent in chemical stability can be formed.

When the light-receiving-side transparent electrode layer 41 (and the light-receiving-side metal seed layer) of one or more embodiments is wrapped around and deposited on the lateral surface and the peripheral edge of the back surface to form the wraparound portion 415 (and wraparound portion 65), the wraparound portion is also exposed to a plating solution during formation of the metal electrodes 71 and 72 by electroplating. Thus, as shown in FIG. 6H, the plated metal layer 75 is deposited on the wraparound portion 415. Since the resist pattern 92 on the back side is also provided on the outer periphery of the back-side transparent electrode layer 42, the plated metal layer 75 deposited on the wraparound portion 415 and the back-side transparent electrode layer 42 (and the back-side metal seed layer 620) are apart from each other.

In one or more embodiments, the plated metal layer deposited on the end portion of the back surface by electroplating forms the end-portion flattening metal layer 75 that flattens the irregularity of a texture on the back surface of the silicon substrate 10, thus contributing to an increase in amount of light captured from the back surface of the solar cell. When the flattening metal layer 75 is formed on the wraparound portion 415 of the first transparent electrode layer, the end-portion flattening metal layer 75 is formed concurrently with the light-receiving-side metal electrode 71 by electroplating. Thus, the end-portion flattening metal layer 75 is composed of the same material as that of the light-receiving-side metal electrode 71.

Figure 6I:
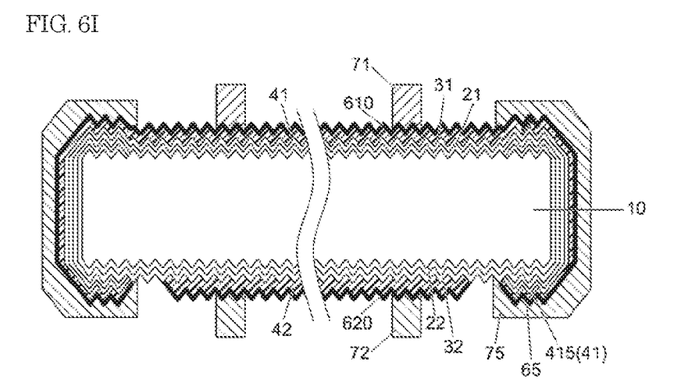
Figure 6J:
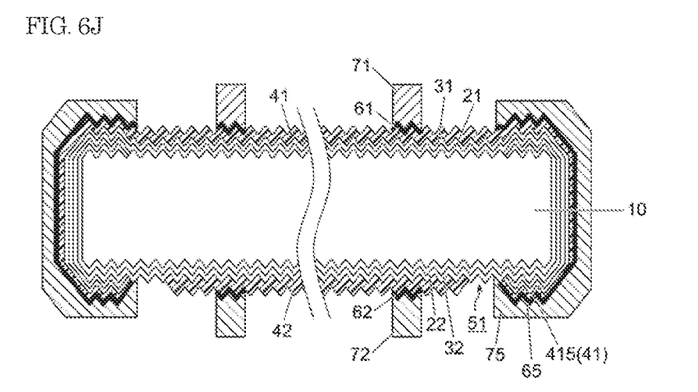

In one or more embodiments, after formation of the metal electrodes 71 and 72 and the end-portion flattening metal layer 75, the resist patterns 91 and 92 are peeled off and removed (FIG. 6I). When the metal seed layers 610 and 620 are disposed on the transparent electrode layers 41 and 42, the metal seed layer exposed between the patterns of the metal electrodes 71 and 72 is removed by etching after the resist pattern is peeled off and removed (FIG. 6J). Accordingly a pattern electrode with the metal seeds 61 and 62 disposed between the transparent electrode layers 41 and 42 and the metal electrodes 71 and 72, respectively, is obtained.

FIGS. 6A to 6J show an example in which the mask 9 is used only for deposition of the electroconductive layers on the back side (the transparent electrode layer 42 and the metal seed layer 620), and the silicon-based thin-films 21, 31, 22 and 32 and the electroconductive layers 42 and 620 on the light-receiving side are deposited without using the mask. The silicon-based thin-film and the electroconductive layer on the light-receiving side may be deposited while the peripheral edge of the substrate is covered with the mask.

Figure 7:
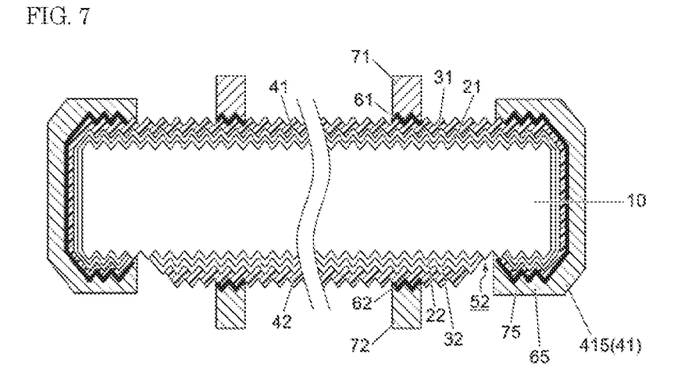
FIG. 7 is a schematic sectional view of a crystalline silicon-based solar cell according to one or more embodiments.

For example, when the second intrinsic silicon-based thin-film 22 and the n-type silicon-based thin-film 32 are deposited while the peripheral edge of the second principal surface is covered with a mask, a separation region 52 where neither the silicon-based thin-film not the electrode is disposed is formed on the peripheral edge of the second principal surface as shown in FIG. 7. When the silicon-based thin-films on the light-receiving side and on the back side are apart from each other as described above, leakage between the p-type silicon-based thin-film and the n-type silicon-based thin-film can be suppressed. Carriers (electrons) cannot be collected in a region where the n-type silicon-based thin-film 32 is absent at the peripheral edge of the second principal surface, and therefore this portion may be a cause of power generation loss. It is to be noted, light from the back surface is not incident to the solar cell in a region which is covered with the end-portion flattening metal layer 75 at the peripheral edge region of the second principal surface, and therefore the generation amount of photocarriers in the separation region 52 and the outer peripheral region thereof (region provided with the end-portion flattening metal layer 75) is small. Thus, the loss caused due to the absence of the n-type silicon-based thin-film in the peripheral edge region is small. On the other hand, the light reflection of the end-portion flattening metal layer 75 increases the amount of light incident from the back surface to a region provided with the n-type silicon-based thin-film 32, and therefore the total power generation amount is enhanced.

As described above, deposition may be performed while the peripheral edge of the first principal surface is covered with a mask during deposition of the transparent electrode layer and the metal seed layer on the light-receiving side. In this case, the wraparound portion of the light-receiving-side transparent electrode layer 41 and the metal seed layer 610 to the back side is not formed. Even when the wraparound portion of the electroconductive layer on the light-receiving side to the back side is not formed, a metal is deposited by a leakage current during electroplating in a region where the n-type silicon-based thin-film 32 is disposed on the n-type silicon substrate 10 without interposing the p-type silicon-based thin-film 31 therebetween. In other words, in a region where only the n-type silicon-based thin-film 32 is disposed on the surface of the n-type silicon substrate 10 and the p-type silicon-based thin-film is not disposed (n/n junction portion) and a region where the n-type silicon-based thin-film 32 is situated closer to the n-type silicon substrate than the p-type silicon-based thin-film 31 (n/n/p junction portion), a metal is deposited due to leakage during electroplating for forming the metal electrodes 71 and 72.

Figure 8:
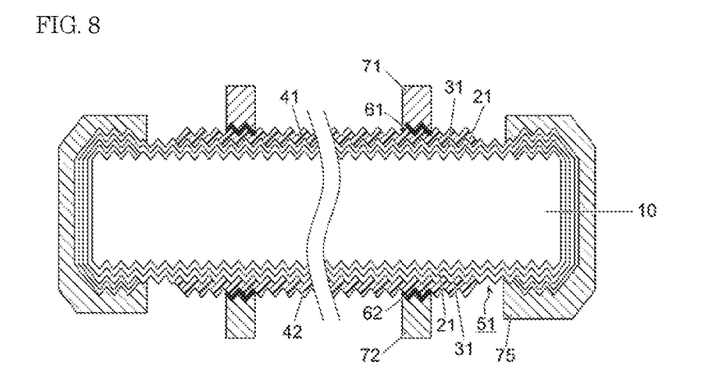
FIG. 8 is a schematic sectional view of a crystalline silicon-based solar cell according to one or more embodiments.

When the n-type silicon-based thin-film 32 is deposited prior to deposition of the p-type silicon-based thin-film 31, the n-type silicon-based thin-film 32 is situated closer to the n-type silicon substrate 10 than the p-type silicon-based thin-film 31 at the lateral surface and the peripheral edge of the principal surface, and therefore the metal layer is deposited over the entire lateral surface and the peripheral edge of the principal surface (except for a region provided with the resist) as shown in FIG. 8. Thus, the back-surface-end-portion flattening metal layer 75 is formed as in the case of depositing the electroconductive layer on the light-receiving side without using a mask.

Figure 9:
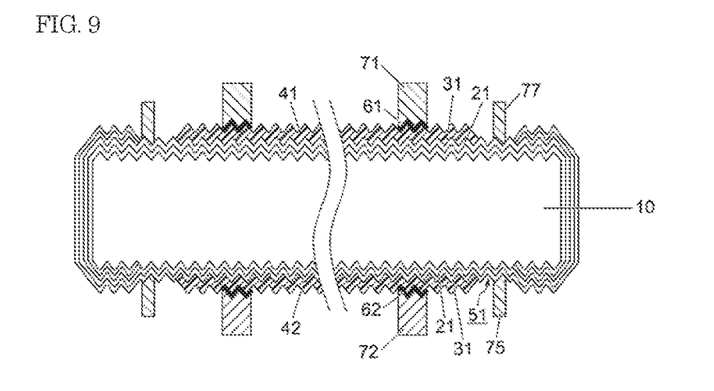
FIG. 9 is a schematic sectional view of a crystalline silicon-based solar cell according to one or more embodiments.

When the p-type silicon-based thin-film 31 is deposited prior to deposition of the n-type silicon-based thin-film 32, the p-type silicon-based thin-film 31 is situated closer to the n-type silicon substrate 10 than the n-type silicon-based thin-film 32 at the lateral surface and the peripheral edge of the principal surface. Thus, as shown in FIG. 9, plated metal layers 77 and 75 are deposited in regions of the peripheral edges of the first principal surface and the second principal surface, where the p-type silicon-based thin-film 31 and the n-type silicon-based thin-film do not overlap each other. In this mode, the plated metal layer 75 deposited on the back side may also act as a back-surface-end-portion flattening metal layer.

For efficiently capturing reflected light, which has reached the end portion on the back surface of the solar cell, from the back side of the solar cell, it is preferable that in one or more embodiments the back-surface-end-portion flattening metal layer 75 is formed on an area as large as possible in a peripheral edge region. Thus, when the electroconductive layers (the light-receiving-side transparent electrode layer 41 and the light-receiving-side metal seed layer 610) on the light-receiving side are deposited using a mask, it is preferable that the n-type silicon-based thin-film 32 is deposited prior to deposition of the p-type silicon-based thin-film 31.

The solar cell of one or more embodiments of the present invention is modularized in practical use. The configuration of the solar cell module is as described above with reference to FIGS. 3, 4A and 4B.

In one or more embodiments, the wiring member 155 is connected onto the plated metal electrode of the solar cell. The wiring member is connected onto the bus bar electrodes when the metal electrode is a grid pattern having finger electrodes and bus bar electrodes as shown in FIG. 3. The wiring member and the electrode are electrically connected using solder, an electroconductive adhesive or the like.

In one or more embodiments, a solar cell module is formed by sandwiching a solar cell string, in which a plural of solar cells 100 are connected, between a light-receiving-surface protecting member 151 and a back-surface protecting member 152 with encapsulant 157 interposed therebetween. For example, the protecting members 151 and 152 are arranged on the light-receiving side and the back side, respectively of the solar cell 100 with the encapsulant 157 interposed therebetween, so that a laminated body is obtained, and thereafter the laminated body is heated under a predetermined condition, whereby the encapsulant 157 is cured to perform encapsulation. As the encapsulant 157, a transparent resin such as EVA, EEA, PVB, silicone, urethane, acryl, epoxy or the like can be used.

As the light-receiving-surface protecting member 151, a material having translucency and water impermeability such as a glass, a transparent plastic, or the like can be used. In one or more embodiments, the back-surface protecting member 152 preferably has light-reflectivity for effectively utilizing the light irradiated on the gaps between adjacent solar cell cells. As the light-reflective back-surface protecting member 152, white color PET film, a laminated film in which a metal foil such as aluminum is sandwiched by resin films, or the like can be used.

The back-surface protecting member 152 may be provided with a member having high light-reflectivity, such as a metal layer, at a portion corresponding to a gap between adjacent solar cells. When the light-reflective member arranged at a portion corresponding to a gap between the solar cells has surface irregularities, the angle of light reflected by the back-surface protecting member can be adjusted to a predetermined direction. Thus, the utilization efficiency of light applied to a gap between the solar cells can be further improved.

Although the disclosure has been described with respect to only a limited number of embodiments, those skilled in the art, having benefit of this disclosure, will appreciate that various other embodiments may be devised without departing from the scope of the present invention. Accordingly the scope of the invention should be limited only by the attached claims.

DESCRIPTION OF REFERENCE CHARACTERS 1 crystalline silicon substrate
21, 22 intrinsic silicon-based thin-film
31, 32 conductive silicon-based thin-film
41, 42 transparent electrode layer
71, 72 metal electrode
61, 62 metal seed
75 end-portion flattening metal layer
51 separation region
100 solar cell
151, 152 protecting member
155 wiring member
157 encapsulant
200 solar cell module

What is claimed is:

1. A method for manufacturing a crystalline silicon-based solar cell, the method comprising:
    forming a light-receiving-side metal electrode by electroplating and forming a back-side metal electrode by electroplating,
    wherein the crystalline silicon-based solar cell comprises:
        a crystalline silicon substrate having a first principal surface, a second principal surface and a lateral surface;
        a first intrinsic silicon-based thin-film;
        a first conductive silicon-based thin-film;
        a light-receiving-side transparent electrode layer;
        the light-receiving-side metal electrode;
        a second intrinsic silicon-based thin-film;
        a second conductive silicon-based thin-film having a conductivity-type different from a conductivity-type of the first conductive silicon-based thin-film;
        a back-side transparent electrode layer;
        the back-side metal electrode, and
        an end-portion flattening metal layer,
    wherein, in the following order from the first principal surface, the first intrinsic silicon-based thin-film, the first conductive silicon-based thin-film, the light-receiving-side transparent electrode layer, and the light-receiving-side metal electrode are arranged on the first principal surface,
    wherein, in the following order from the second principal surface, the second intrinsic silicon-based thin-film, the second conductive silicon-based thin-film, the back-side transparent electrode layer, and the back-side metal electrode are arranged on the second principal surface,
    wherein both the first principal surface and the second principal surface are textured,
    wherein both the light-receiving-side metal electrode and the back-side metal electrode have a pattern shape,
    wherein the back-side transparent electrode layer is not provided on a peripheral edge of the second principal surface,
    wherein the end-portion flattening metal layer is disposed on the peripheral edge of the second principal surface,
    wherein the end-portion flattening metal layer has a thickness of 1 µm or more,
    wherein the end-portion flattening metal layer and the back-side transparent electrode layer are apart from each other,
    wherein the end-portion flattening metal layer is also formed by electroplating, and
    wherein the end-portion flattening metal layer and the light-receiving-side metal electrode are formed at the same time.

2. The method according to claim 1,
    wherein in the formation of the back-side metal electrode by electroplating, a back-side resist layer is used, and
    wherein a back-side electroconductive layer exposed under an opening of a resist pattern is an origination point of the electroplating.

3. The method according to claim 1, wherein at least one of the first intrinsic silicon-based thin-film or the second intrinsic silicon-based thin-film is disposed on the entire first principal surface, the entire second principal surface and all regions of the lateral surface of the crystalline silicon substrate.

4. The method according to claim 1,
    wherein the first conductive silicon-based thin-film is disposed on the entire first principal surface and the lateral surface, and
    wherein the second conductive silicon-based thin-film is disposed on the entire second principal surface and the lateral surface.

5. The method according to claim 1, wherein the end-portion flattening metal layer has a thickness of 3 µm or more.

6. The method according to claim 1, wherein the end-portion flattening metal layer has a thickness of 5 μm or more.

7. The method according to claim 1,
wherein deposition of the back-side transparent electrode layer is performed while the peripheral edge of the second principal surface is covered with a mask, thereby the back-side transparent electrode layer is not formed on a peripheral edge of the second principal surface,
wherein the light-receiving-side transparent electrode layer is disposed on the entire first principal surface, the lateral surface, and the peripheral edge of the second principal surface in a wraparound manner, and
wherein the light-receiving-side transparent electrode layer disposed on the peripheral edge of the second principal surface and the back-side transparent electrode layer are apart from each other.

8. The method according to claim 1,
wherein the light-receiving-side transparent electrode layer is disposed on the entire first principal surface, the lateral surface, and the peripheral edge of the second principal surface in a wraparound manner, and
wherein the light-receiving-side transparent electrode layer disposed on the peripheral edge of the second principal surface and the back-side transparent electrode layer are apart from each other.

9. The method according to claim 8, wherein the end-portion flattening metal layer is disposed on the light-receiving-side transparent electrode layer that is disposed on the peripheral edge of the second principal surface.

10. The method according to claim 2,
wherein the back-side resist layer is formed on the back-side electroconductive layer by a printing method.

11. The method according to claim 2, wherein the back-side electroconductive layer is a back-side metal seed disposed on the back-side transparent electrode layer.

12. The method according to claim 2, wherein in formation of the light-receiving-side metal electrode by electroplating, a light-receiving-side resist layer is used, and a light-receiving-side electroconductive layer exposed under an opening of a resist pattern is an origination point of the electroplating.

13. The method according to claim 12, wherein the light-receiving-side electroconductive layer is a light-receiving-side metal seed disposed on the light-receiving-side transparent electrode layer.

14. A method for manufacturing a crystalline silicon-based solar cell, the method comprising:
forming a light-receiving-side metal electrode by electroplating and forming a back-side metal electrode by electroplating,
wherein the crystalline silicon-based solar cell comprises:
a crystalline silicon substrate having a first principal surface, a second principal surface and a lateral surface;
a first intrinsic silicon-based thin-film;
a first conductive silicon-based thin-film;
a light-receiving-side transparent electrode layer;
the light-receiving-side metal electrode;
a second intrinsic silicon-based thin-film;
a second conductive silicon-based thin-film having a conductivity-type different from a conductivity-type of the first conductive silicon-based thin-film;
a back-side transparent electrode layer;
the back-side metal electrode, and
an end-portion flattening metal layer,
wherein, in the following order from the first principal surface, the first intrinsic silicon-based thin-film, the first conductive silicon-based thin-film, the light-receiving-side transparent electrode layer, and the light-receiving-side metal electrode are arranged on the first principal surface,
wherein, in the following order from the second principal surface, the second intrinsic silicon-based thin-film, the second conductive silicon-based thin-film, the back-side transparent electrode layer, and the back-side metal electrode are arranged on the second principal surface,
wherein both the first principal surface and the second principal surface are textured,
wherein both the light-receiving-side metal electrode and the back-side metal electrode have a pattern shape,
wherein the back-side transparent electrode layer is not provided on a peripheral edge of the second principal surface,
wherein the end-portion flattening metal layer is disposed on the peripheral edge of the second principal surface,
wherein the end-portion flattening metal layer has a thickness of 1 μm or more,
wherein the end-portion flattening metal layer and the back-side transparent electrode layer are apart from each other,
wherein in the formation of the back-side metal electrode by electroplating, a back-side resist layer is used,
wherein a back-side electroconductive layer exposed under an opening of a resist pattern is an origination point of the electroplating,
wherein the back-side resist layer is formed on the back-side electroconductive layer by a printing method,
wherein the back-side resist layer is printed to cover an entire region where the back-side transparent electrode layer is formed, and
wherein the back-side resist layer is not formed on the peripheral edge of the second principal surface.

15. A method for manufacturing a crystalline silicon-based solar cell, the method comprising:
forming a light-receiving-side metal electrode by electroplating and forming a back-side metal electrode by electroplating,
wherein the crystalline silicon-based solar cell comprises:
a crystalline silicon substrate having a first principal surface, a second principal surface and a lateral surface;
a first intrinsic silicon-based thin-film;
a first conductive silicon-based thin-film;
a light-receiving-side transparent electrode layer;
the light-receiving-side metal electrode;
a second intrinsic silicon-based thin-film;
a second conductive silicon-based thin-film having a conductivity-type different from a conductivity-type of the first conductive silicon-based thin-film;
a back-side transparent electrode layer;
the back-side metal electrode, and
an end-portion flattening metal layer,
wherein, in the following order from the first principal surface, the first intrinsic silicon-based thin-film, the first conductive silicon-based thin-film, the light-receiving-side transparent electrode layer, and the light-receiving-side metal electrode are arranged on the first principal surface,
wherein, in the following order from the second principal surface, the second intrinsic silicon-based thin-film, the second conductive silicon-based thin-film, the back-side transparent electrode layer, and the back-side metal electrode are arranged on the second principal surface, wherein both the first principal surface and the second principal surface are textured, wherein both the light-receiving-side metal electrode and the back-side metal electrode have a pattern shape, wherein the back-side transparent electrode layer is not provided on a peripheral edge of the second principal surface, wherein the end-portion flattening metal layer is disposed on the peripheral edge of the second principal surface, wherein the end-portion flattening metal layer has a thickness of 1 μm or more, wherein the end-portion flattening metal layer and the back-side transparent electrode layer are apart from each other, and wherein deposition of the back-side transparent electrode layer is performed while the peripheral edge of the second principal surface is covered with a mask, thereby the back-side transparent electrode layer is not formed on a peripheral edge of the second principal surface.

* * * * *